United States Patent
Kawahashi et al.

[11] Patent Number: 6,003,828
[45] Date of Patent: Dec. 21, 1999

[54] MEANS FOR SUPPORTING A MASK

[75] Inventors: Takashi Kawahashi, Yamato; Hiromi Kai, Akishima, both of Japan

[73] Assignee: Ushiodenki Kabushiki Kaisha, Tokyo, Japan

[21] Appl. No.: 09/085,017

[22] Filed: May 28, 1998

[30] Foreign Application Priority Data

May 29, 1997 [JP] Japan ..................................... 9-139857

[51] Int. Cl.⁶ .......................... F16M 13/00; G03B 27/58; G03B 27/62
[52] U.S. Cl. ........................... 248/576; 248/581; 355/76; 355/72
[58] Field of Search ................................... 248/576, 575, 248/577, 578, 580, 581, 582, 592, 346.04, 346.05; 355/53, 72–76; 430/5; 358/498; 378/34, 35, 204, 205, 207, 208

[56] References Cited

U.S. PATENT DOCUMENTS

| | | | |
|---|---|---|---|
| 4,185,915 | 1/1980 | Volent et al. | 355/77 |
| 4,764,791 | 8/1988 | Omata et al. | 355/26 |
| 4,888,488 | 12/1989 | Miyake | 250/492.1 |
| 5,157,438 | 10/1992 | Beale | 355/72 |
| 5,544,213 | 8/1996 | Chiba et al. | 378/34 |
| 5,602,622 | 2/1997 | Ziegler | 355/75 |

FOREIGN PATENT DOCUMENTS 774096  3/1995  Japan .

*Primary Examiner*—Derek J. Berger
*Assistant Examiner*—Michael Nornberg
*Attorney, Agent, or Firm*—Sixbey, Friedman, Leedom & Ferguson; David S. Safran

[57] ABSTRACT

To prevent tilting or bending of a large mask frame holder and at the same time to prevent distortion when the mask holding frame is attached to a support base by ball plungers in three of the four corner areas of a mask holding frame that engage V groove bodies which face the ball plungers on the surface of the base, compression springs are provided in those three corners which pre-stress the mask holding frame toward the support base while a compression spring is provided between the remaining corner area of the mask holding frame and the base which acts in a direction pressing the mask holding frame away from the support base, thereby preventing the mask holding frame from bending or tilting. As an alternative, in each of the three pre-stressed corner areas of the mask holding frame, instead of a compression spring, an elastic attachment component in the form of a bracket with spring-like legs mounted to the supporting component can be provided.

8 Claims, 7 Drawing Sheets

MEANS FOR SUPPORTING A MASK

BACKGROUND OF THE INVENTION

1. Field of the Invention

The invention relates to a means for supporting a mask holding frame for suction and attachment of a mask which is used for an exposure device, a proximity exposure device and the like. The invention especially relates to a means for supporting a mask holding frame with a device which adjusts the vertical angle of the mask holding frame and holds the mask surface perpendicular to the optical axis.

2. Description of Related Art

FIGS. 9 and 10 each schematically show a conventional means for supporting a mask holding frame. FIG. 10 is a cross-sectional view taken along line A—A in FIG. 9. In the drawing, a mask holding frame 1 and a base 2 are shown which, together form a mask carrier.

Mask holding frame 1 has a means which suctions a mask (not shown) by vacuum or similar methods. Furthermore, in the three corner areas A, B, and C of mask holding frame 1, there are screw openings in which ball plungers 3 are installed. In the vicinity of the openings for the ball plungers 3, there are through openings which are penetrated by mounting pins 4. On the respective mounting pin 4, are a washer 6 and a compression spring 5 (disk spring or helical spring).

In base 2 are V-sleeves 7 which are engaged by ball plungers 3, and screw openings 8 to which mounting pins 4 are joined. Mask holding frame 1, as shown in FIG. 10, is installed on base 2 by means of the mounting pins 4 and ball plungers 3, and is prestressed by compression springs 5 toward the base 2.

By the arrangement of ball plungers 3 in three corner areas A, B, and C the height of ball plungers 3 which are located on two orthogonally intersecting axes can be adjusted. Thus the vertical angle of mask holding frame 1 can be adjusted. Therefore the adjustment process can be simplified.

In FIGS. 9 and 10, the position adjustment of mask holding frame 1 is done in the manner described below.

(1) In mask holding frame 1, a mask (not shown) is attached by means of a vacuum chuck.

(2) By screwing ball plungers 3 up or down the vertical angle of mask holding frame 1 with respect to base 2 is changed and adjusted such that the mask surface becomes perpendicular to the optical axis of the exposure light of the exposure device.

(3) Mounting pins 4 are screwed down and mask holding frame 1 is attached.

This holding means has a simple configuration, and can be easily produced and adjusted. Furthermore, mask holding frame 1 is always pressed with a constant force in the direction toward base 2 by the compression springs 5 installed on mounting pins 4. The distance between mask holding frame 1 and the base 2 does not change. This holding means therefore has the feature that the tilt of the mask relative to the optical axis does not change even after use over a long time.

Recently, there has been a need for holding a large mask (for example, one with dimensions of 400 mm×400 mm) which is used for exposure of a liquid crystal substrate. The mask holding frames are therefore becoming larger and larger. As a result, the arrangement shown in FIGS. 9 and 10 has the following defects:

(1) When the mask holding frame 1 becomes larger, in the arrangement shown in FIGS. 9 and 10, the corner area D which is provided neither with ball plunger 3 nor V sleeve 7, is bent or tilted by its own weight, as shown in FIGS. 11(a) or 11(b).

When bending/tilting occurs in mask holding frame 1, the mask installed therein is also bent or tilted. The distance between the mask and the workpiece is therefore no longer constant. The mask surface is no longer perpendicular to the optical axis. Furthermore, in the mask image which is projected onto the workpiece there are points at which no imaging takes place. Therefore, the exposure accuracy is reduced.

(2) To eliminate the tilt of the holding frame for a large mask, in the arrangement shown in FIGS. 9 and 10, the spring constant of the compression springs 5 of mounting pins 4 or the number of disk springs can be increased, and thus, the force is increased with which the three corner areas A, B, and C of mask holding frame 1 are pressed in the direction toward base 2, so that corner area D which is not provided with a ball plunger is raised without being tilted.

However, if the force with which mask holding frame 1 is pressed in the direction toward base 2 is increased, the force with which ball plungers 3 are loaded also becomes greater. In the arrangement shown in FIGS. 9 and 10, the points which are exposed to the force of the mounting pins 4 differ from the points which are exposed to the force of ball plungers 3. If the above described pressing force becomes greater, distortions occur in mask holding frame 1 between the points at which mounting pins 4 are installed and the points on which plungers 3 are installed. Therefore, the defect of bending of the mask holding frame cannot be eliminated solely by increasing the pressing force.

(3) In a proximity exposure device, for parallel adjustment of the mask and workpiece relative to one another with a constant distance, a distance setting process is used which, for example, is described in Japanese patent disclosure document HEI 7-74096. In the distance setting process, the workpiece is moved upward, pushed against the bottom of the mask and then moved farther upward. The overall surface of the workpiece is brought into contact with the mask, and the mask and the workpiece are positioned parallel to one another (hereinafter this actuation is called "parallel arrangement"). While maintaining this state, the workpiece is separated from the mask only to a given degree and the two are set parallel to one another, and at the same time, with a constant distance relative to one another.

In the case of distance setting by this process, in the arrangement shown in FIGS. 9 and 10 mounting pins 4 for attaching mask holding frame 1 are located only in three corner areas A, B, and C. When the workpiece is pressed from underneath and brought into contact with the mask to bring the entire surface of the mask and the entire surface of the workpiece into contact with one another, corner area D of mask holding frame 1 is bent upward. Therefore, parallel arrangement of the mask and workpiece relative to one another cannot be done correctly.

SUMMARY OF THE INVENTION

The invention was devised to eliminate the above described defects in the prior art. Therefore, a first object of the invention is to devise a means for holding a mask carrier in which the tilting and bending of a large mask holding frame, which corresponds to a large mask, can be prevented.

A second object of the invention is to devise a means for holding a mask carrier in which no distortion occurs in the mask holding frame, even if the force with which the mask holding frame is pressed in the direction toward the base is increased.

The third object of the invention is to devise a means for holding a mask carrier in which the mask holding frame does not bend upwards if distance setting is done in a proximity exposure device.

The above described objects are achieved in accordance with the invention in a means for supporting a mask holding frame which has a rectangular mask holding frame for attachment of a mask and a supporting component to support the mask holding frame as follows:

(1) In three of the four corner areas of the mask holding frame there are three support axes which can each be moved in a direction which orthogonally intersects the surface of the mask holding frame. At points opposite these three support axes of the surface of the supporting component are three V-groove bodies. In the vicinity of the support axes of the mask holding frame there is a respective through opening. The through openings are penetrated by mounting pins, one end of the respective mounting pin being installed in a screw opening which is located in the supporting component. Between the other ends of the mounting pins and the mask holding frame there are first elastic components by which the mask holding frame is prestressed on the side of the supporting component. Furthermore, between the remaining corner area of the mask holding frame and the supporting component there is a second elastic component which prestresses the mask holding frame towards the side opposite the supporting component.

(2) In at least three of the four corner areas of the mask holding frame there are protrusions. In three of these protrusions are three support axes which can be moved in a direction which orthogonally intersects the surface of the mask holding frame. At points opposite these three support axes of the surface of the supporting component are three V-groove bodies. The three protrusions are attached in the supporting component such that the support axes are pressed directly from overhead by plate-like, elastic attachment components which surround the protrusions.

(3) In solution (2) between the mask holding frame or the protrusion of the remaining one corner area of the four corner areas of the mask holding frame and the supporting component there is a second elastic component which prestresses the mask holding frame towards the side opposite the supporting component.

(4) In solutions (1), (2), and (3) in the corner area of the mask holding frame provided with the second elastic component or on the protrusion located in this corner area there is a position control component, by which position control is done so that the corner area of the mask holding frame does not move when the mask holding frame is exposed to a compressive force from the side of the supporting component.

In accordance with the first embodiment of the invention, between the remaining one corner area of the four corner areas of the mask holding frame and the supporting component is the second elastic component which prestresses the mask holding frame towards the side opposite the supporting component, as was described above in solution (1). Therefore, in a large mask holding frame the latter is prevented from tilting or bending. Furthermore, by the support of one corner area of the mask holding frame by the second elastic component, it is not necessary to increase the screw-down force of the mounting pins. Distortions of the mask holding frame can be prevented.

In the second embodiment of the invention, in at least three of the four corner areas of the mask holding frame are protrusions which are attached in the supporting component in such a way that the support axes are pressed directly upward by plate-like, elastic attachment components which surround the protrusions, as was described in solution (2). This measure prevents distortions from occurring in the mask holding frame even if the screw-down force by the attachment components is increased. Therefore, tilting of the mask holding frame can be prevented by the screw-down force of the attachment components.

In accordance with a further aspect of the second embodiment of the invention, the measure described above in solution (3) prevents the mask holding frame from tilting or bending even if the mask holding frame is large.

In accordance with the measure described above in solution (4), that the corner area of the mask holding frame provided with the second elastic component, or that there is a component for position control on the protrusion located in this corner area, prevents the corner area from being raised even when the mask holding frame, in a parallel arrangement of the mask and workpiece relative to one another in proximity exposure, is subjected to a compressive force from the side of the supporting component. Therefore, parallel arrangement can be done correctly.

In the following, the invention is further described using several embodiments shown in the drawings.

DETAILED DESCRIPTION OF THE PREFERRED EMBODIMENTS

Figure 1:
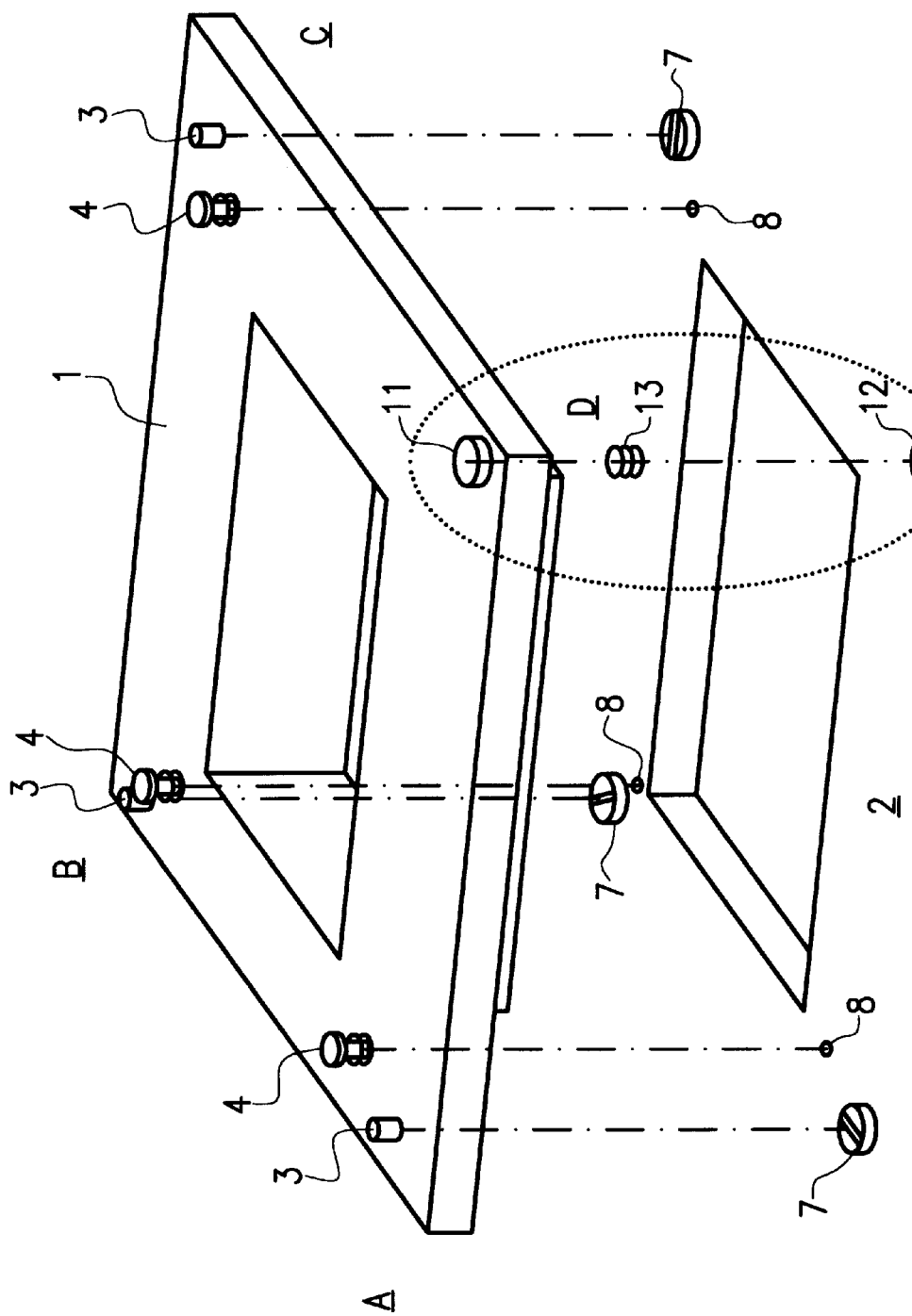
FIG. 1 shows a schematic of a first embodiment of the invention.

In the following descriptions, to facilitate comparison, the parts of the inventive embodiments that are shared with the above-described known device bear the same reference numerals.

(1) Embodiment 1

Figure 2:
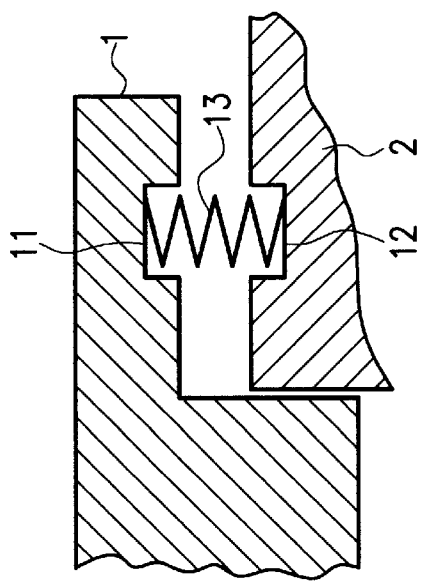
FIG. 2 shows a schematic of the support means for corner area D in the first embodiment.
Figure 10:
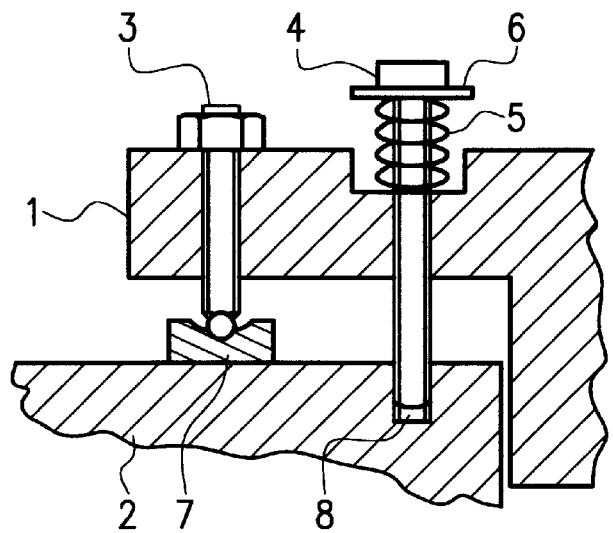
FIG. 10 shows a schematic of an attachment arrangement of the mask holding frame in FIG. 9.
Figure 11A:
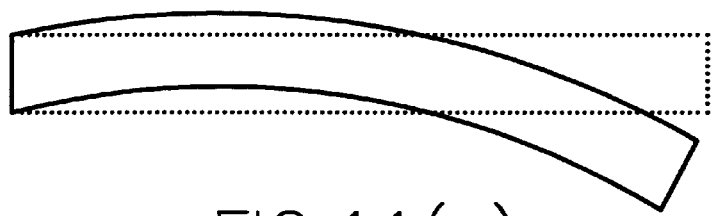
FIG. 11a shows a schematic of the bending of the mask holding frame.
Figure 11B:
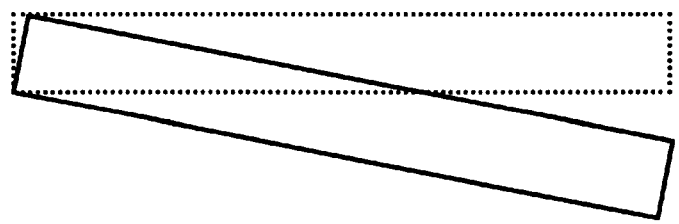
FIG. 11b shows a schematic of the tilting of the mask holding frame.

FIGS. 1 and 2 schematically show a first embodiment of the invention in which tilting and bending of a large mask holding frame under its own weight is prevented. In FIG. 1, a mask holding frame 1 has ball plungers 3 installed in three corner areas A, B and C as was described above using FIG. 10. In the vicinity of plungers 3 are through openings which are penetrated by mounting pins 4. On each mounting pin 4 is a respective washer 6 and a compression spring 5 (plate spring or helical spring). The mounting pins 4 are screwed into screw openings 8 which are located in base 2 and the tips of the ball plungers 3 are engage these V-sleeves 7 located in base 2, as was described above.

In corner area D of mask holding frame 1, which is not provided with ball plunger 3, and in base 2, are concave parts 11, 12, as is shown in FIG. 2. In recesses 11, 12, there is a helical compression spring 13. The spring constant of helical compression spring 13 is selected to be large enough to support a weight defined essentially by $(W_f+W_m)/4$ (where $W_f$ is the weight of mask holding frame 1 and $W_m$ is the weight of the mask) when compression spring 13 is compressed to a length which corresponds to the distance between the mask holding frame 1 and base 2.

In this embodiment, installation of the mask holding frame 1 is performed as in the above described conventional example in the manner described below.

(1) A mask (not shown) is attached by means of a vacuum chuck in the mask holding frame 1.

(2) By screwing ball plunger 3 up or down, the vertical angle of mask holding frame 1 is changed with regard to base 2 and is set such that the mask surface becomes perpendicular to the optical axis of the exposure light of the exposure device.

(3) Mounting pins 4 are screwed down and mask holding frame 1 is attached. In this embodiment, as was described above, between mask holding frame 1 in corner area D which is not provided with ball plunger 3, and base 2 there is helical compression spring 13 by which ¼ of the sum of the weight of mask holding frame 1 and the weight of the mask is supported. Mask holding frame 1 is, therefore, neither tilted nor bent when the screw-down force of mounting pins 4 is low. Furthermore, mask holding frame 1 is not distorted because the screw-down force can be reduced in the above described manner.

In this embodiment, the above described measure that, in corner area D of mask holding frame 1 which is not provided with ball plunger 3, there is a compression spring 13 which supports roughly ¼ of the sum of the weight of mask holding frame 1 and the weight of the mask, even in a larger mask holding frame 1, mask holding frame 1 can be prevented from tilting or bending under its own weight. Also, mask holding frame 1 is prevented from being distorted because the screw-down force of mounting pins 4 can be reduced.

(2) Embodiment 2

Figure 3:
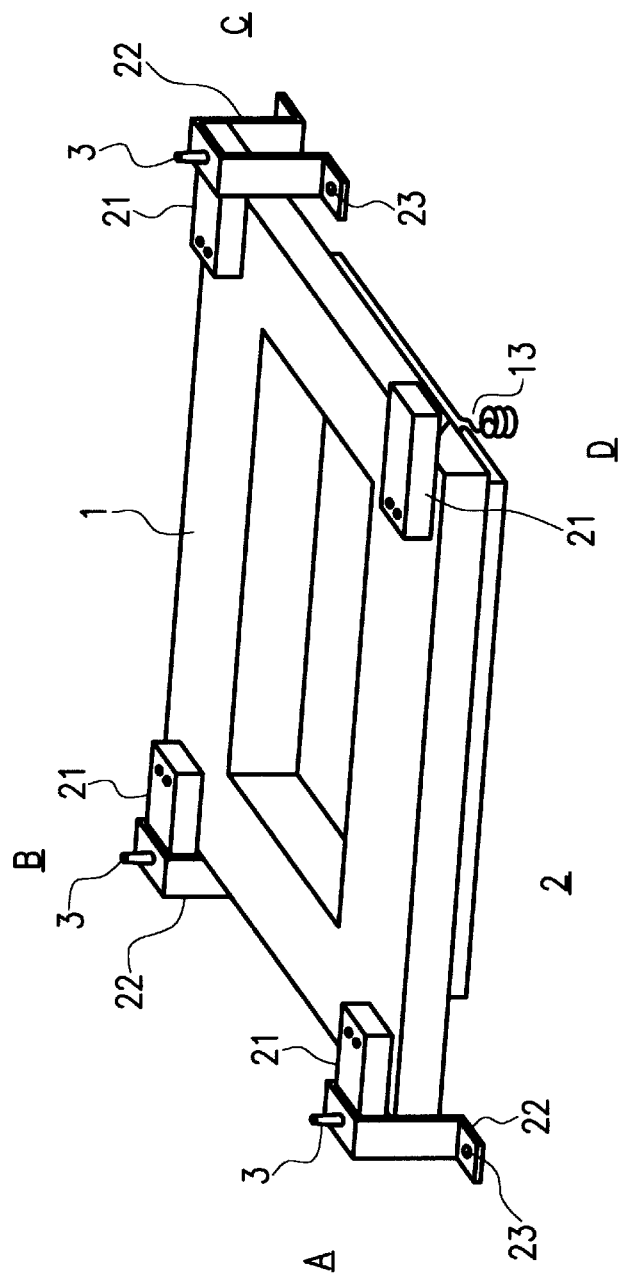
FIG. 3 shows a schematic of a second embodiment of the invention.
Figure 4A:
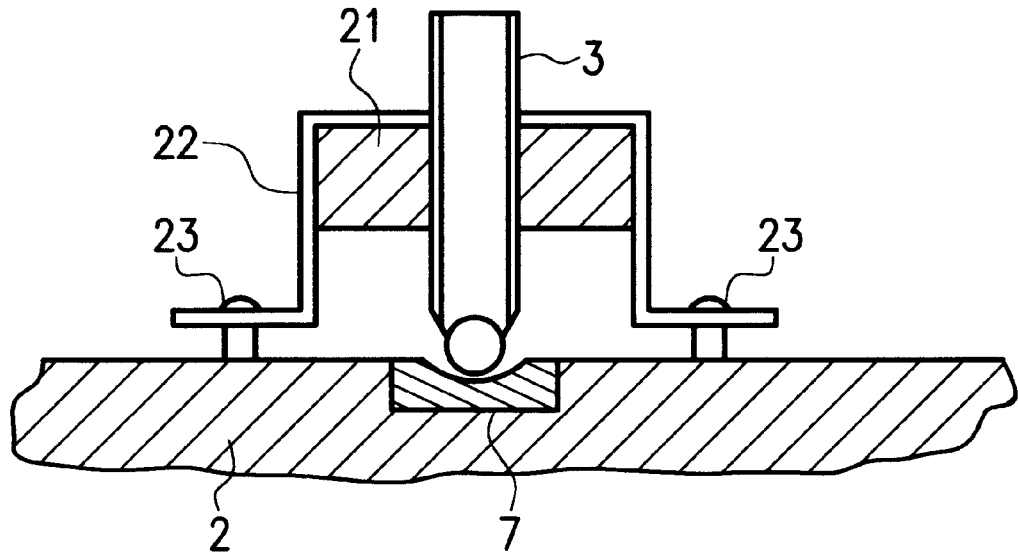
FIGS. 4a and 4b show a schematic of the installation arrangement of a protrusion in the second embodiment of the invention.

FIGS. 3, 4(a), 4 (b) and 5 schematically show a second embodiment of the invention. In it, the tilting and bending of mask holding frame 1 is prevented, and at the same time, an arrangement for holding mask holding frame 1 is shown in which no distortion occurs in mask holding frame 1, even if the force with which mask holding frame 1 is pressed in the direction toward base 2 is increased.

In FIG. 3, protrusions 21, 21' are shown installed in the four corner areas A, B, C and D of mask holding frame 1 with screws and the like. The protrusions 21 in the three corners areas A, B, and C are each installed on base 12 by an attachment bracket 22.

Attachment bracket 22, as shown in FIG. 4 (a), has the shape of a recessesd plate and surrounds protrusion 21, its two ends being installed on the base 2 by means of a pair of mounting screws 23. The recess of attachment bracket 22 has an opening positioned to align with a screw opening in the respective protrusion 21. The ball plungers 3 penetrate the openings of attachment brackets 22, and thus, can be installed in the screw openings of the protrusions 21 so that the tips of ball plungers 3 engage the V-sleeves 7 located in base 2.

Figure 5:
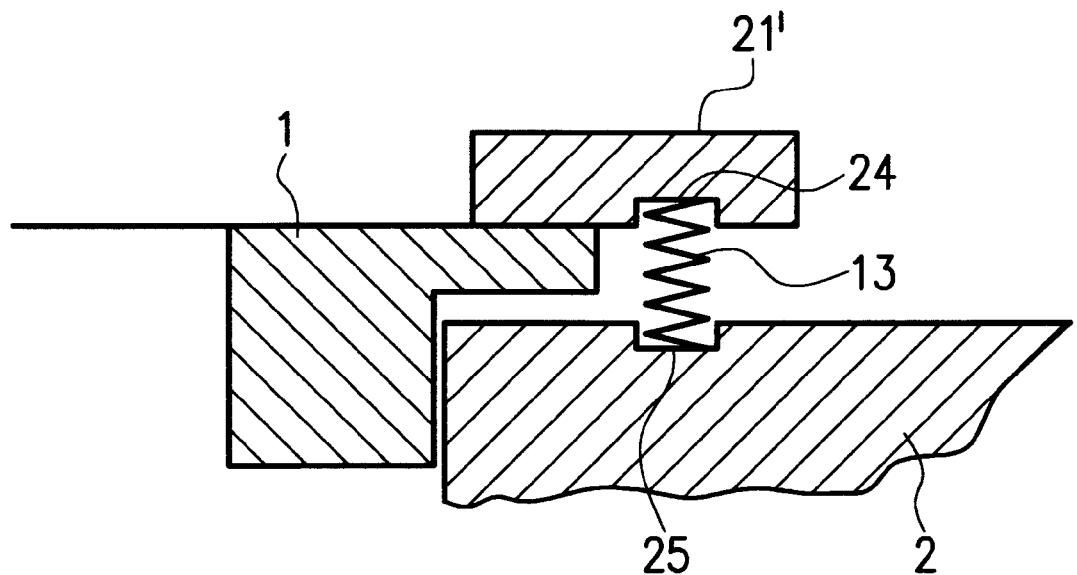
FIG. 5 shows a schematic of the support means for corner area D in the second embodiment.

In the protrusion 21' which is installed at the remaining corner area D, there is recess 24, as shown in FIG. 5. Between recess part 25 located in base 2 and the recess 24, there is a helical compression spring 13. The spring constant of helical compression spring 13 is selected to have a size with which a weight is supported which is defined essentially as $(W_f+W_m)/4$ (where $W_f$ is the weight of mask holding frame 1 and $W_m$ is the weight of the mask) when compression spring 13 is compressed to a length which corresponds to the distance between mask holding frame 1 and base 2, as in the above described example.

In this embodiment, the installation of mask holding frame 1 is performed as follows.

(1) In mask holding frame 1, a mask (not shown) is attached by means of a vacuum chuck.

(2) By screwing ball plungers 3 up or down, the vertical angle of the mask holding frame 1 is changed with regard to base 2 and is set such that the mask surface becomes perpendicular to the optical axis of the exposure light of the exposure device.

Figure 4B:
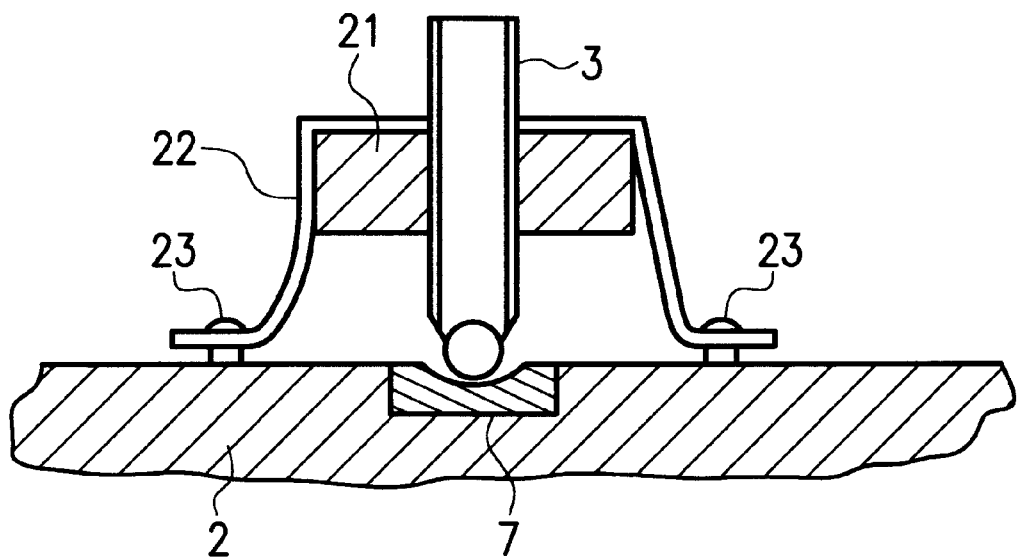

(3) Mask holding frame 1 is attached by screwing down mounting pins 23 of attachment brackets 22. In doing so, attachment brackets 22 deform and act as springs as is shown in FIG. 4(b), so that they always press the protrusions 21 with a constant force in the direction toward the base 2.

Here, a case was described in which in four corner areas of mask holding frame 1 are protrusions 21, 21'. However, without placing the protrusion 21' in the corner area D which is not provided with ball plunger 3, compression spring 13 can be placed between the mask holding frame 1 and base 2, as was described on the first embodiment.

Since mask holding frame 1 is not very large, attachment of attachment brackets 22 with the installed in protrusions 21 can prevent the mask holding frame 1 from tilting. In the case in which bending of mask holding frame 1 is not a problem, compression spring 13 need not be installed.

By the above described arrangement of the holding means in this embodiment, protrusions 21 are pressed essentially vertically in the direction toward base 2 when mounting screws 23 are screwed down and, by means of attachment brackets 22, mask holding frame 1 is attached on base 2. Therefore, ball plunger 3 can be pressed essentially directly from overhead. This prevents distortion from occurring in mask holding frame 1 even if the screw-down force by mounting screws 23 is increased. In the case of a mask holding frame 1 which is not too great, it is therefore possible to prevent tilting of mask holding frame 1 by screwing down with the mounting screws 23.

Furthermore, the measure that attachment brackets 22 always press protrusions 21 with a constant force in the direction of the base prevents the distance between mask holding frame 1 and base 2 from growing and the tilt with respect to the optical axis of the mask from changing.

In addition, the arrangement of helical compression spring 13 between base 2 and the protrusion 21' which is installed in corner area D which is not provided with ball plunger 3, even in a larger mask holding frame 1, mask holding frame 1 can be prevented from tilting or bending under its own weight.

(3) Embodiment 3

Figure 6:
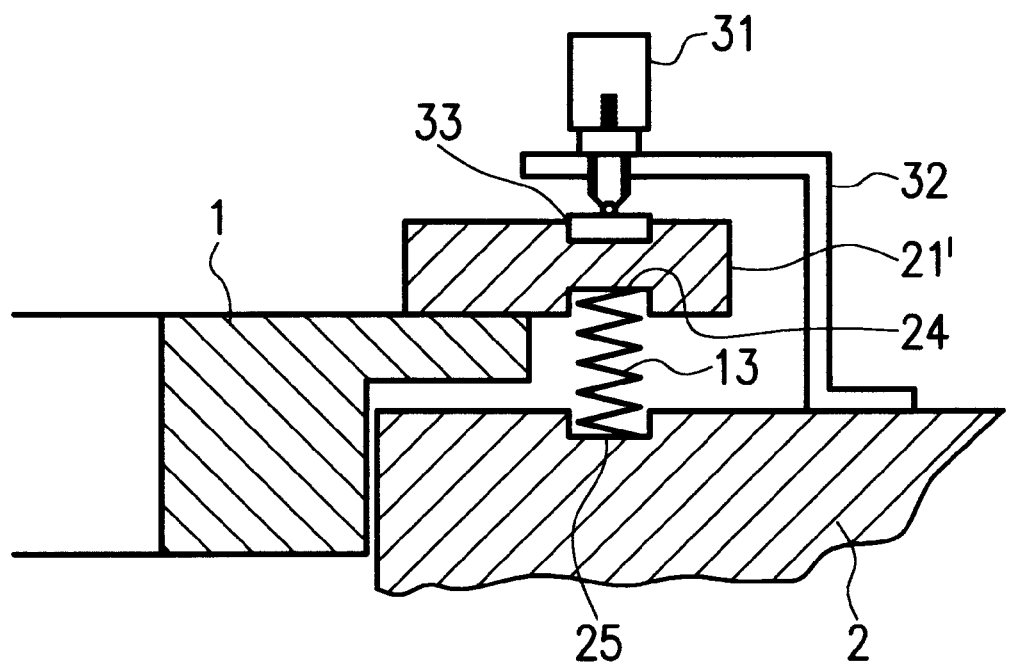

FIG. 6 shows a third embodiment of the invention. In this embodiment, there is a means which prevents the corner area D of the mask holding frame 1 which is not provided with a ball plunger 3 from being raised when the workpiece is pressed against the bottom of the mask in a proximity exposure device and the mask and workpiece are arranged parallel to one another.

FIG. 6 schematically shows a means for supporting the protrusion 21' shown in FIG. 3. The other parts are identical to the parts in FIG. 3.

In this embodiment, in the same way as in FIG. 5, between recess 24 located in protrusion 21' and recess 25 located in base 2, there is helical compression spring 13, as is apparent from the drawing. A stopper component 32 which is installed on base 2 and in which there is micrometer 31. On mask holding frame 1 is a flat insert 33 with which the tip of micrometer 31 is in contact.

Figure 7:
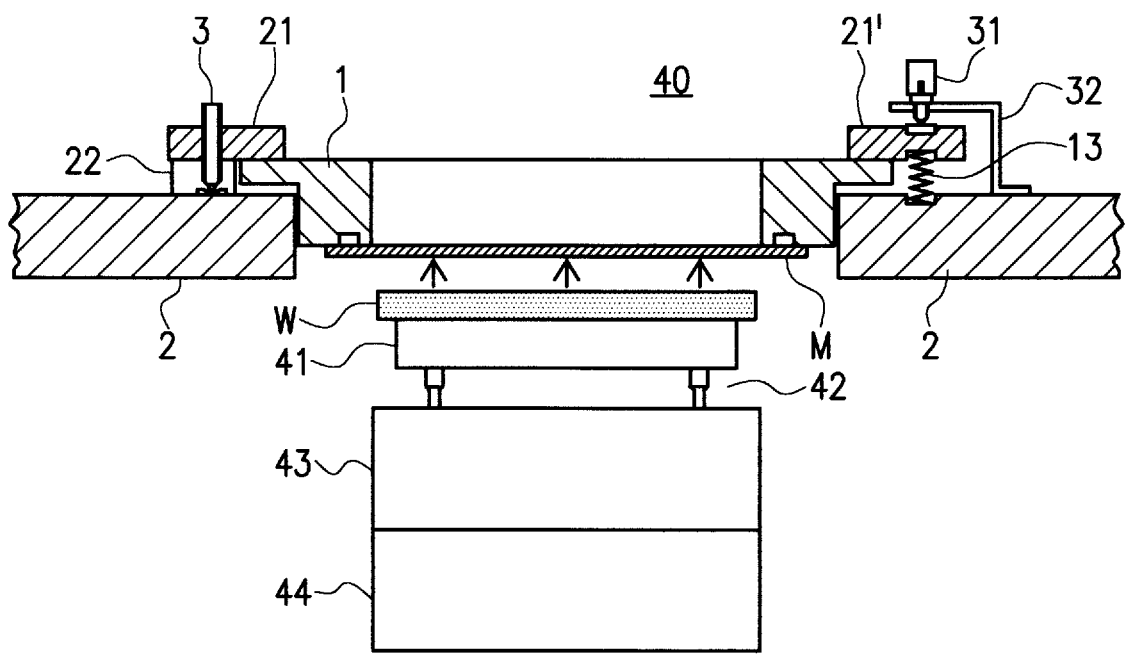
FIG. 7 shows a schematic of the arrangement of a proximity exposure device to which the third embodiment is applied.

FIG. 7 schematically shows the arrangement of a proximity exposure device for which the third embodiment is used. In the drawing, mask carrier 40 is comprised of the mask holding frame 1 and base 2. On the bottom of mask holding frame 1, a mask M is attached by means of a vacuum chuck or the like. Furthermore, as was described above, protrusions 21, 21' are installed in the four corner areas of mask holding frame 1. Protrusions 21 provided with ball plungers 3 are attached to base 2 using attachment brackets 22. Between protrusion 21' and base 2 is helical compression spring 13. Upward motion of protrusion 21' is controlled by micrometer 31 and stopper component 32 shown in FIG. 6.

A workpiece W is placed on workpiece carrier 41 and is moved by X-Y-Θ carrier 43 in the X-Y-Θ directions (for example, X: to the right and left in FIG. 7, Y: in the direction which orthogonally intersects the X-direction and which is parallel to the surface of the workpiece; and Θ: in the direction of rotation around the axis which orthogonally intersects the X-Y plane). Furthermore, workpiece W is moved by means of Z carrier 44 in the Z-direction (to the top and bottom in FIG. 7: in the direction which orthogonally intersects the X-Y plane).

Between X-Y-Θ carrier 43 and workpiece carrier 41 is a distance setting device 42 by which the mask M and workpiece W are set parallel to one another at a predetermined distance from each other. For distance setting device 42, the distance setting device disclosed by the applicant in Japanese patent disclosure document HEI 7-74096 can be used.

Above mask M is an exposure light irradiation device (not shown). After setting the distance between mask M and workpiece W, and after alignment of mask M and workpiece W, exposure light is irradiated from the exposure light irradiation device via mask M onto workpiece W, and a mask pattern is exposed onto the workpiece.

In the following, installation of mask holding frame 1 and setting of the distance between mask M and workpiece W in this embodiment is described.

(1) Mask M is mounted in mask holding frame 1. Mask M is held by a vacuum chuck or the like located in mask holding frame 1.

(2) Control of mask M and the optical axis of the exposure light, movement of workpiece carrier 41 in the Z direction and parallel adjustment of mask carrier 40 are carried out in the manner described below.

(A) By controlling the height of ball plungers 3 of mask holding frame 1, its vertical angle is changed with respect to base 2 and the measure of the vertical position is set between the optical axis of the exposure light and mask M.

(B) The height of ball plungers 3 is fixed. Mounting screws 23 of attachment brackets 22 are screwed down and mask holding frame 1 is attached.

(C) By means of an alignment device (not shown) which is located in Z-carrier 44, setting is accomplished such that the Z-motion direction of workpiece carrier 41 becomes perpendicular to mask M.

(D) Micrometer 31 is set such that mask holding frame 1 is not raised from a given position if, in parallel placement of mask M and workpiece W to one another, workpiece W collides with mask M.

The above described setting of micrometer 31 is performed, for example, as follows:

First of all, a state is established in which the tip of micrometer 31 and flat insert 33 of mask holding frame 1 are not in contact with one another. A dial gauge (not shown) is brought into contact with the surface of mask holding frame 1, the reading of the dial gauge being stored at this time. Next, the tip of micrometer 31 is moved down, brought into contact with flat insert 33 of mask holding frame 1, and pushed slightly in. This changes the reading of the dial gauge. The position of the tip of micrometer 31 is set such that the reading of the dial gauge becomes identical to its stored value.

(3) Workpiece W is placed on workpiece carrier 41 and held by a vacuum chuck or the like.

(4) Workpiece carrier 41 is moved upward by Z-carrier 44. Workpiece W and mask M held in mask holding frame 1 are brought into contact with one another.

(5) Workpiece carrier 41 is moved farther up. This shifts distance setting device 42, and workpiece W and mask M tightly adjoin one another and lie on top of one another over their entire surfaces. This means that the inclination of mask M and workpiece W agree with one another and the two become parallel to one another. In doing so, pressure is applied to the mask holding frame 1 in an upward direction; but, it is also held down by micrometer 31. This prevents mask holding frame 1 from being pushed up.

(6) While keeping the shifted state of distance setting device 42 constant, workpiece W is moved down by a given amount by means of Z-carrier 44. In this way, the workpiece W and the mask M are set parallel to one another, and at the same time, at a predetermined distance relative to one another.

(7) Workpiece W and mask M are aligned by an alignment system (not shown).

(8) Workpiece W and mask M are set relative to one another with the exposure distance. An exposure light irradiation device (not shown) emits exposure light and workpiece W is exposed.

Above, the second embodiment was used and protrusion 21' was pressed down by micrometer 31 from overhead. However, the above descriptions also apply to use of the first embodiment, i.e., in the vicinity of the corner region D of mask holding frame 1 which is not provided with ball plunger 3, stopper component 32 can be installed and corner area D of mask holding frame 1 can be pressed down from overhead by micrometer 31.

Figure 8:
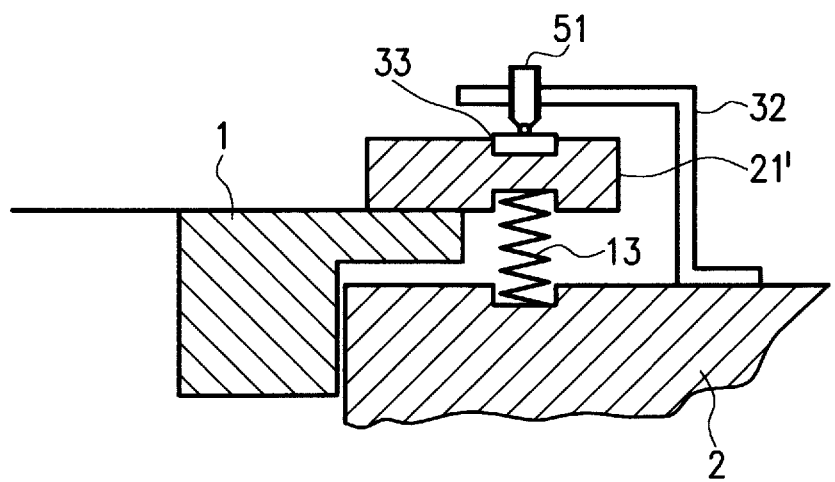
FIG. 8 shows a schematic of a case of using a ball plunger instead of a micrometer in the third embodiment.
Figure 9:
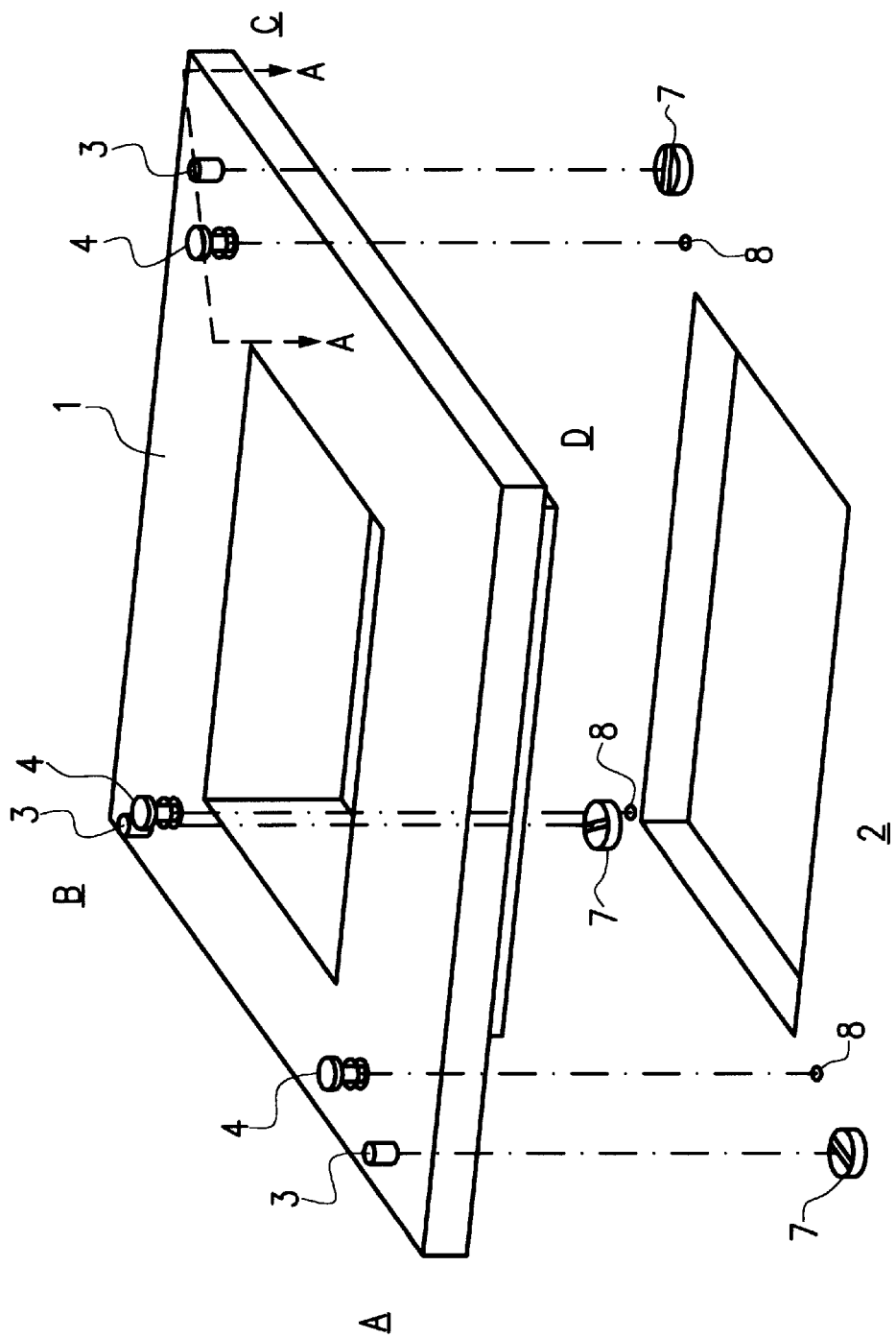
FIG. 9 shows a schematic of a conventional means for supporting a mask holding frame.

An embodiment was described above in which in the stopper component 32 is a micrometer 31, and thus, mask holding frame 1 is prevented from being raised when parallel placement is performed. However, instead of the micrometer, for example, a ball plunger 51 as shown in FIG. 8, or a component for positioning with another arrangement, can be used.

As was described above, in this embodiment, a stopper component 32 is installed on the base 2 in which micrometer 31 or ball plunger 51 is located. Micrometer 31 or ball plunger 51 presses down mask holding frame 1 from overhead. This prevents mask holding frame 1 from being raised in parallel placement of mask M and workpiece W to one another. Therefore, parallel placement of mask M and workpiece W correctly relative to one another can be achieved. Furthermore, precision position setting can be easily performed using micrometer 31.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

Action of the Invention

As was described above, the following effects can be obtained by the invention.

(1) The measure that there is a second elastic component which prestresses the mask holding frame towards the side opposite the supporting component in a large mask holding frame between the remaining corner area, of the four corner areas of the mask holding frame, which is not provided with a ball plunger and the supporting component, prevents bending or tilting of the mask holding frame. Furthermore, by supporting one corner area of the mask holding frame by the second elastic component, it is unnecessary to increase the screw-down force of the mounting pins so that distortions of the mask holding frame can be prevented.

(2) The measures that there are protrusions in at least three of the four corner areas of the mask holding frame, that in three of these protrusions there are three support axes which can be moved in the direction which orthogonally intersects the surface of the mask holding frame, and that the three protrusions are attached in the supporting component such that the support axes are pressed down directly from overhead by plate-like, elastic attachment components which surround the protrusions, prevents distortions in the mask holding frame even if the screw-down force by the attachment components is increased. Therefore, tilting of the mask holding frame by the screw-down force of the attachment components can be prevented.

(3) In solution (2), between the mask holding frame or the protrusion of the remaining one corner area of the four corner areas of the mask holding frame and the supporting component, there is a second elastic component which prestresses the mask holding frame towards the side opposite the supporting component. This measure prevents the mask holding frame from tilting or bending, even if the mask holding frame is large.

(4) In solutions (1), (2), and (3), in the corner area of the mask holding frame provided with the second elastic component, or on the protrusion located in this corner area, there is a component for position control. This measure prevents the corner area of the mask holding frame from being raised, even when the mask holding frame is exposed to a compressive force from the side of the supporting component in parallel placement of the mask and workpiece relative to one another in proximity exposure. Therefore, parallel placement can be correctly performed.

We claim:

1. A device for supporting a mask, comprising a rectangular mask holding frame for attachment of a mask and a supporting component for supporting the mask holding frame;

wherein, in three of four corner areas of the mask holding frame, there is a respective support axis which can each be moved in a direction which orthogonally intersects a surface of the mask holding frame;

wherein, at each of three points opposite the support axes in said three corners, a respective V-groove body is provided on a surface of the supporting component;

wherein a through opening is provided in the vicinity of each of the support axes of the mask holding frame, each through opening being penetrated by a respective mounting pin, a first end of each mounting pin being installed in a respective screw opening located in the supporting component;

wherein first elastic components are disposed between second ends of the mounting pins and the mask holding frame, said first elastic components pre-stressing the mask holding frame toward the supporting component; and wherein a second elastic component is disposed between the fourth corner area of the mask holding frame and the supporting component, said second elastic component pre-stressing the mask holding frame away from the supporting component.

2. A device for supporting a mask as claimed in claim 1, wherein a position control means for preventing movement of the corner area of the mask holding frame, when the mask holding frame is exposed to a compressive force in a direction from the supporting component toward the mask holding frame, is provided in the fourth corner area of the mask holding frame.

3. A device for supporting a mask as claimed in claim 2, wherein the position control means is provided on a protrusion located in said fourth corner area.

4. A device for supporting a mask comprising a rectangular mask holding frame for attachment of a mask thereto and a supporting component for supporting the mask holding frame, said rectangular mask holding frame including four corner areas;

wherein protrusions are provided in at least three of the four corner areas of the rectangular mask holding frame which are movable in a direction which orthogonally intersects the rectangular mask holding frame wherein each protrusion extends beyond a surface of the mask holding frame in a direction parallel to the surface of the mask holding frame;

wherein a V-groove body is provided at a respective point opposite each of the protrusions for supporting the respective protrusion on the supporting component;

and wherein each protrusion is pressed against the respective V-groove body directly from above by a respective elastic attachment component which surrounds each protrusion.

5. A device for supporting a mask holding frame as claimed in claim 4, wherein a second elastic component is disposed between the mask holding frame of the fourth of the four corner areas of the mask holding frame and the supporting component, said second elastic component pre-stressing the mask holding frame away from the supporting component.

6. A device for supporting a mask as claimed in claim 4, wherein a position control means for preventing movement of the corner area of the mask holding frame, when the mask holding frame is exposed to a compressive force in a direction from the supporting component toward the mask holding frame, is provided in the fourth corner area of the mask holding frame.

7. A device for supporting a mask as claimed in claim 6, wherein the position control means is provided on a protrusion located in said fourth corner area.

8. A device for supporting a mask as claimed in claim 4, wherein each elastic attachment component comprises a bracket with legs mounted to the supporting component.

* * * * *